United States Patent [19]
Aimar et al.

[11] 4,059,787
[45] Nov. 22, 1977

[54] METHOD FOR THE AUTOMATIC LOCATION OF PARTICULAR ZONES OF A SURFACE AND AN INSTALLATION FOR THE APPLICATION OF SAID METHOD

[75] Inventors: Jean Louis Aimar, Mennecy; Gérard Olin, Le-Plessis-Robinson, both of France

[73] Assignee: SEVE, Chatillon-sous-Bagneux, France

[21] Appl. No.: 670,271

[22] Filed: Mar. 25, 1976

[30] Foreign Application Priority Data

Mar. 28, 1975 France .................................. 75.09846

[51] Int. Cl.² ............................................. G05B 19/42
[52] U.S. Cl. ................................... 318/568; 318/577; 318/640; 250/202
[58] Field of Search ............... 318/568, 577, 640, 574; 250/202

[56] References Cited
U.S. PATENT DOCUMENTS

| | | | |
|---|---|---|---|
| 3,532,893 | 10/1970 | Marantette | 250/202 |
| 3,610,935 | 10/1971 | Voros | 250/202 |
| 3,703,674 | 11/1972 | Doxey | 318/577 |
| 3,774,098 | 11/1973 | Moss | 318/577 X |
| 4,002,900 | 1/1977 | Sitnichenko et al. | 318/577 X |

*Primary Examiner*—B. Dobeck
*Attorney, Agent, or Firm*—H. Gibner Lehmann; K. Gibner Lehmann

[57] ABSTRACT

Particular zones are given a distinctive appearance with respect to surrounding areas on a surface such as a printed-circuit board to be drilled in an automatic process. The surface is automatically scanned in a system of two rectilinear perpendicular coordinates by a reader comprising at least one detector which is responsive to the distinctive appearance. The coordinates of the surface points for which the detector delivers a signal representing the presence of the distinctive appearance during the scanning are recorded in a coded form which can be utilized by the automatic machine.

19 Claims, 20 Drawing Figures

METHOD FOR THE AUTOMATIC LOCATION OF PARTICULAR ZONES OF A SURFACE AND AN INSTALLATION FOR THE APPLICATION OF SAID METHOD

This invention relates to a method for the automatic location of particular zones on a surface as well as to an installation for the application of the method. Automatic location is primarily of interest in the field of elaboration of instructions for the automatic control of machining operations performed by machines which work on the point by point principle. In fact the zones located can accordingly represent points to be machined on the surface of a workpiece which is intended to be treated by a machine of this type. The invention permits automatic determination of these points and makes it possible to record their coordinates in a coded form which can be utilized by the machine as well as any other machine control instructions such as, for example, characteristics of selection of the tool which is intended to be employed at each point.

The invention applies in a particularly advantageous manner although not in any limiting sense to the fabrication of printed circuits. It is known that the fabrication of printed circuits entails on the one hand the need to drill holes for receiving electronic components in an insulating support and on the other hand the fabrication on said support by etching of conductive circuits which provide connections between the holes. In the first place the invention accordingly offers the advantage of avoiding the need for manual centering of the holes to be drilled since this is a long and tedious operation which often gives rise to errors or omissions. In the second place the invention permits the use of one and the same document both for etching the circuits and for drilling the holes in a fully automatic process. In fact the elaboration of drilling instructions for an automatic-control drilling machine can advantageously be carried out from a photographic positive of the circuits on a transparent sheet which is employed in the etching process.

The invention is thus directed to a method for locating particular zones on a surface, especially points to be machined on the surface of a workpiece to be treated by a machine which operates point by point. The method consists in providing the particular zones with a distinctive appearance with respect to the region surrounding said zones on said surface, in automatically scanning the surface in a system of two coordinates, especially perpendicular rectilinear coordinates, by means of a reader comprising at least one detector which is responsive to said distinctive appearance; and in recording in coded form, especially in a coded form which can be utilized by said automatic machine, the coordinates of the points of the surface for which the detector delivers during the scanning operation a signal which represents the presence of said distinctive appearance.

The invention is further concerned with a method for the automatic location of particular zones on a surface, especially of points to be machined on the surface of a workpiece by an automatic machine which operates point by point, said method being distinguished by the fact that it consists:

in giving said particular zones as distinctive appearance with respect to the region surrounding said zones on said surface, especially an appearance which is transparent at the center of an opaque pastille, in automatically scanning the surface in a system of two coordinates, especially perpendicular rectilinear coordinates, by means of a reader comprising at least one detector which is responsive to said distinctive appearance, in establishing by means of electrical signals delivered by the reader a primary image coded in binary notation in which two different states represent respectively the presence and absence of said distinctive appearance at each point of the surface which is scanned by the detector, in processing said primary image in coded form in order to erase in successive points from the edges thereof in accordance with said system of coordinates all the states which are representative of the presence of the distinctive appearance encountered before a zone of absence of said distinctive appearance in order to obtain a clear image in coded form only of those points which have said distinctive appearance and are separated from the edges of the image by one point or a plurality of successive points which do not have said distinctive appearance, in determining the coordinates of at least a certain number of the points having a distinctive appearance which remain on said clear image.

In accordance with a preferred mode of execution of the method, the primary image is processed in successive lines in logical erasing circuits which, in the case of each point having an index $n$ on a line having an index $m$, satisfy the equations:

$$Al, m, n = Ao, m, n . (\overline{Eo, m-1, n} + \overline{E'o, m, n-1} + \overline{E'o, m, n+1})$$

$$E'o, m, n = Ao, m, n . (Eo, m-1, n + E'o, m, n-1 + E'o, m, n+1)$$

where $Ao$, $Eo$, $Al$, $E'o$ are given the following notations respectively, in binary code form:

$Ao$ represents a line of the primary image, $Eo$ represents the erasing instructions of the preceding line, $Al$ represents the line obtained after erasing, $E'o$ represents the erasing instructions of the processed line, and erasure is imposed on the one hand in the case of the two end points of each line and on the other hand in the case of all the points of the first line of the image.

The primary image is advantageously processed twice within said erasing circuits, namely a first time at successive points from the first to the last line and a second time at successive points from the last to the first line.

In the practical application of the method, different primary images are established successively during scanning of the surface and processed separately, preferably in alternate sequence within two different erasing-circuit units. It is thus possible to subject each image to a first erasing process from the first to the last line (hereinafter designated as "forward" erasure) during the period of scanning of the image by the reader, then to a second erasing process from the last to the first line (hereinafter designated as "return" erasure) during the period of scanning of the following image by the same reader. The dimensions of the individual images are chosen so as to ensure that each zone to be located and its surrounding area can be wholly contained within an image and that, in addition, each image can contain only a limited number of such zones, for example two or three in each dimension of the stage. This second condition has the advantage in particular of facilitating accurate determination of the coordinates of the center of each zone aforesaid in the event of their extending over a number of reading points scanned by the reader and also of facilitating the recording of these coordinates in coded form. Furthermore, it is an advantage to define the successive images in such a manner that they overlap to a partial extent on the scan surface over a sufficient width to ensure that any one zone to be located and its surrounding area can be wholly contained therein.

The coordinates of the zones to be located on the observed surface can be determined from the coded data of the clear image obtained after erasure as hereinabove defined and from the instantaneous coordinates of the scanning reader which have been converted to a coded form. These coordinates can be corrected so as to take into account the period of time which is necessary for processing the primary image by erasure and which elapses between reading and determination of the coordinates.

It must be understood that scanning of the surface can be produced by material displacement of the reader but can just as readily be carried out in a static form by successive switching of a series of detectors carried by a common reading head. In one particular embodiment of the invention in which these two forms are combined, an image in coded form covers a series of reading lines obtained during a displacement of a reading head over the surface along a first axis of coordinates, each line being intended to contain the coded data delivered at each step by a series of detectors placed in aligned relation within the reading head and parallel to a second axis of coordinates.

As has already been mentioned, a preferred application of the invention is concerned with the fabrication of printed circuits and more precisely with the elaboration of instructions for drilling holes by means of a photoetching positive. On a photographic positive of this type, the drawing of the circuit to be etched appears opaque on a transparent sheet. Within the scope of the invention, use is made more especially of photographic films in which, in addition, the center point of the holes to be pierced is defined by a zone or a transparent point surrounded by an opaque zone by virtue of special "pastilles" which are pierced at the center. The dimensions of the pastilles are chosen in relation to the reading step along the two scanning axes, with the result that each transparent zone and similarly each opaque zone cover at least one reading step.

The alernative mode of execution of the method which entails an erasing process as defined in the foregoing is particularly well suited in this application to printed circuits since it permits the possibility of distinguishing the holes to be pierced as represented by pastilles from the circuits which connect these latter. In this case, reading is performed on the sheet by transparency by means of photosensitive detecting elements.

In another mode of execution, the invention is also concerned with the determination of coordinates of the center points of zones to be located when these latter are likely to extend over a number of reading points, especially in the case of a zone shape having a circular contour or a polygonal contour and having a center of symmetry. The method contemplated by the invention accordingly consists in utilizing electrical signals delivered by the reader during a scan of a surface in steps of equal length in a system of perpendicular coordinates in order to establish an image of successive scanning lines in coded form containing a zone with a contour having a center of symmetry of reading points which have the distinctive appearance whereas the other points of the image do not have said distinctive appearance, in determining at each line on the one hand the number A of successive lines comprising at least one point which has said distinctive appearance and on the other hand the number B corresponding to one-half the number of points which have said distinctive appearance on the last line received, in comparing the numbers A and B at each line and, when A becomes equal to or higher than B, in recording the corresponding coordinates of the reader converted to coded form which correspond substantially to the center point of said zone.

In the particularly advantageous but non-limitative case in which the above-mentioned embodiment is employed in conjunction with the erasing process defined earlier, especially within the definition of the application to the elaboration of drilling instructions for a printed circuit, the determination of center points of zones having a distinctive appearance is carried out on the clear image obtained in coded form after the process of erasing of the primary image.

The scope of the invention naturally extends to installations for the practical application of the method in the different embodiments of this latter.

The characteristic features of an installation of this type as well as other properties and advantages of the method according to the invention will be more clearly brought out by the following description in connection with a particular embodiment of the invention which is not given in any limiting sense. This description relates more especially to the determination of coordinates of the holes to be pierced in a printed circuit by an automatic drilling machine, starting from a surface of the circuit in which this latter is defined by opaque zones on a transparent sheet and the hole locations are defined by opaque pastilles each having a transparent central zone.

Reference will be made to the accompanying drawings, in which.

The apparatus or installation described comprises on the one hand a mechanical portion which carries out automatic scanning of the printed-circuit surface by a reader and on the other hand an electronic portion which ensures production of images in coded form from electrical signals delivered by the reader during the scan, the processing of said images and the determination of center points of holes to be drilled as well as the recording of these coordinates and other data in coded form.

Figure 1:
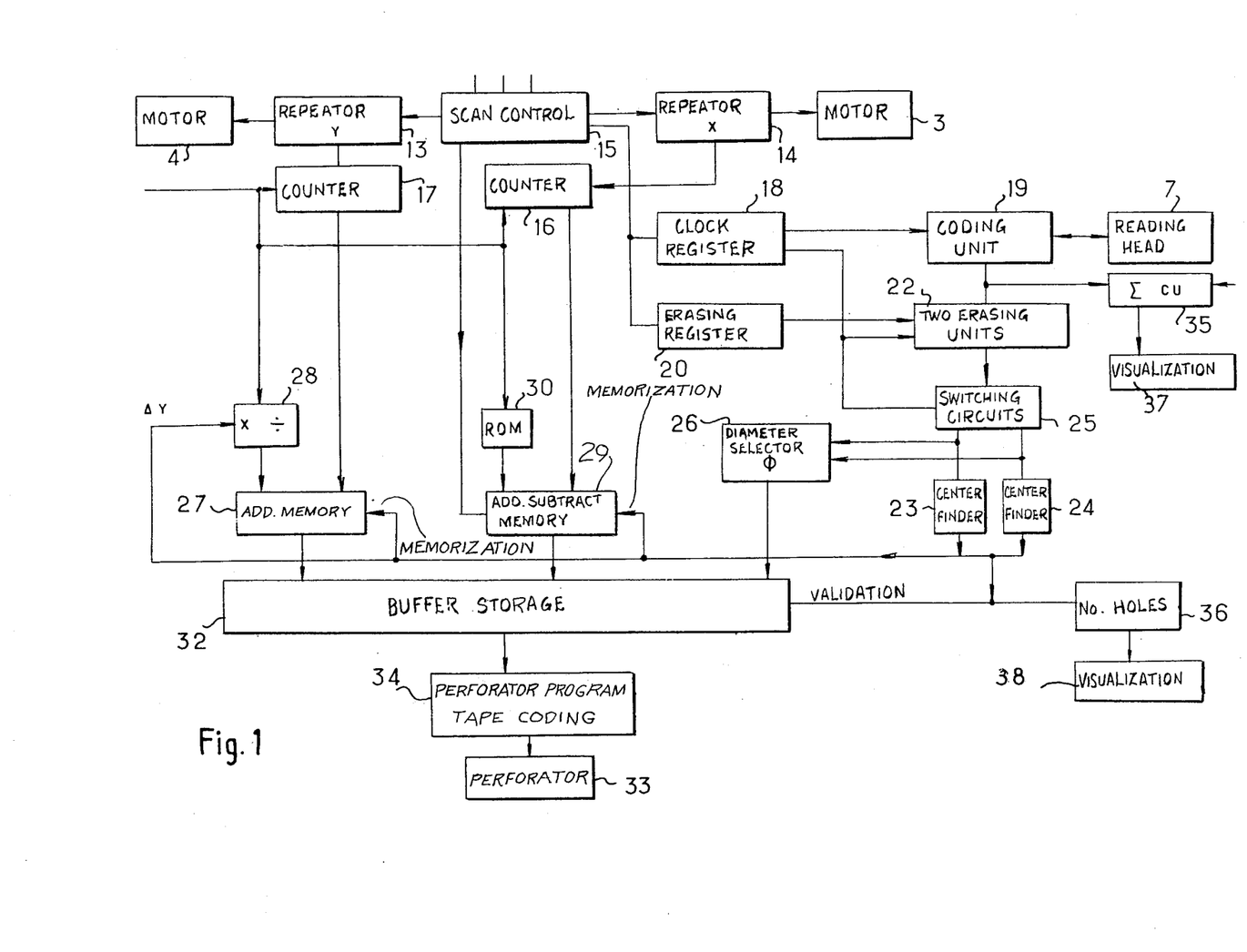
FIG. 1 is a general diagram of the installation.
Figure 2:
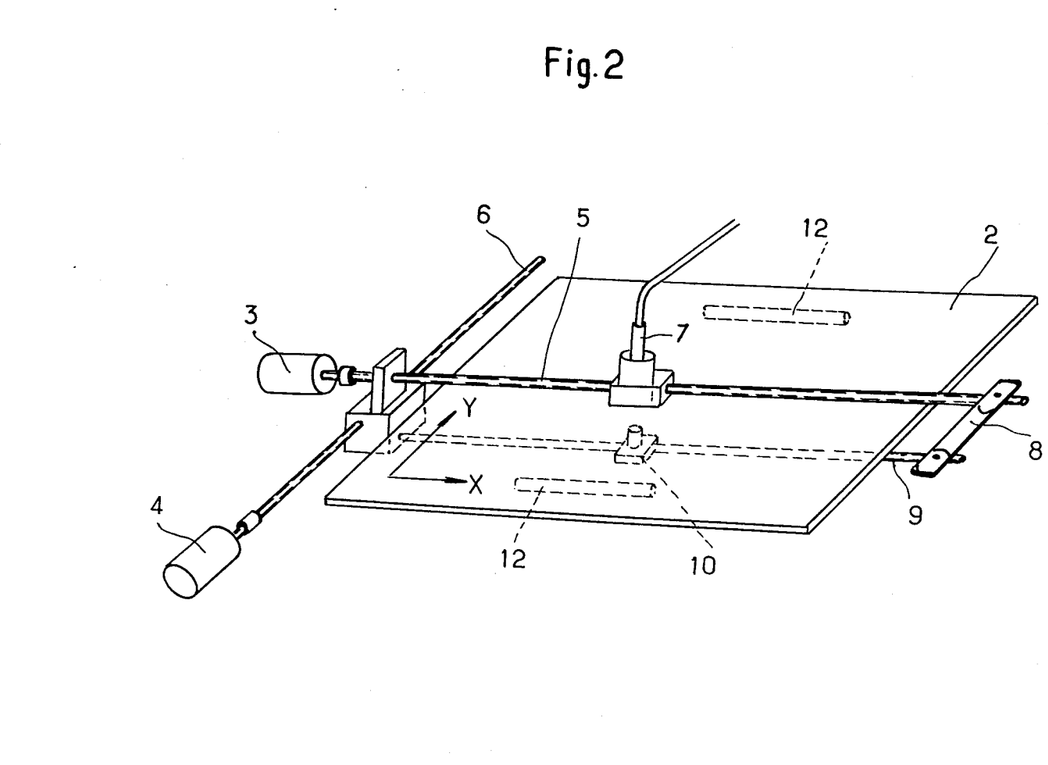
FIG. 2 illustrates the essential features of the mechanical design of the reading table.

The design of the mechanical portion is illustrated diagrammatically in FIG. 2 whereas FIG. 1 shows the functional relationships between said portion and the remainder of the installation. Scanning is carried out on a reading table 2 consisting of a transparent glass plate on which the document to be analyzed in placed and is constituted in this instance by the photoetching positive of a printed circuit. A grid-screen placed beneath said plate permits approximate visualization of the two perpendicular scanning axes A and Y.

The two scanning movements along the axes X and Y are carried out respectively by a motor X designated by the reference numeral 3 and a motor Y designated by the reference numeral 4. These motors drive in rotation two endless screws or worm gears 5 and 6 respectively; these latter in turn support and drive carriages in a step-by-step translational movement. The carriage which is mounted on the worm gear 5 in parallel relation to the X-axis carries the reading head 7 above the table. A mechanical counter-motion drive system 8 transmits the rotational motion of the worm gear 5 to a parallel worm gear which drives a light source 10 placed beneath the table opposite to the reading head in synchronism with this latter. The movement along the Y-axis is carried out by the motor 4 after each forward or return scan along the X-axis. Two auxiliary lamps 12 serve to illuminate the table with cold light except during reading operations, in particular for placing the document and ensuring definition of the scanning margins prior to initiation of the automatic scan.

The reading head 7 comprises a linear photoelectric network constituted by photosensitive elements aligned parallel to the Y-axis. This consists by way of example of an integrated-circuit network constituted by 64 photosensitive elements placed in line over a distance of 3.25 mm. Said network is associated with an electronic device on a printed circuit which serves to receive the control signals of the network and to amplify the electrical signals delivered by the photosensitive elements.

Two repeaters 13 and 14 (as shown in FIG. 1) serve to start-up the motors X and Y respectively by means of scan control signals derived from the electronic portion.

The electronic portion of the installation mainly comprises the following elements (as shown in FIG. 1):

a scan control unit 15 connected to the electrical supply for controlling the repeaters of the motors X and Y as a function of the orders indicated by hand and the forward-motion counters;

counters 16 and 17 or X and Y counters associated respectively with the repeaters for defining at any instant the position of the reading head at X and Y, for transposing these values in a form corresponding to the scale selected and to the resolution of the machine to be employed for drilling holes in the printed circuit and for defining the margins or limits of excursion of the reading head prior to initiation of the scan;

a clock register 18 which delivers all the elementary control signals required for the operation of the complete assembly and for data-processing;

a coding or digitizing unit 19 for establishing the images of the document in binary-code form;

an erasing register 20 which has the function of monitor or switching unit for the data which are primarily employed in the erasing operations;

two erasing units 22 comprising logic circuits and associated storage devices which make it possible by means of the "primary" image (formed in the unit 19) to produce a "clear" image which contains only drilling data;

center-finding units 23 and 24 for determining the coordinates of the center points of holes to be drilled by means of clear-image data transmitted by switching circuits 25;

a diameter-selecting unit 26 for determining the drilling diameter as a function of the data contained in the clear image;

an assembly 27-28-29-30 for recalibrating coordinates which makes it possible to provide the true drilling coordinates as a function of the real coordinates of the reading head, of the resolution of the drilling machine, of the scale, of the necessary data-processing times;

a buffer store 32 records and switches the output data relating to the drilled holes to synchronism with the operation of the installation and retransmits said data in synchronism with a program for recording in a coded form which is suited to the automatic control of the drilling machine.

In the particular case described, the recording operation aforesaid is carried out on tape by means of a perforator 33 which receives the data from the buffer store 32 via a transfer unit 34 containing the perforator program and the tape-coding instructions. However, said perforator could be replaced by any other data-acquisition device, on magnetic tape or on disc, for example.

Finally, the installation further comprises a unit 35 which serves to visualize at 37 the circuit surface to be etched, said surface being calculated by means of the primary image data, and a unit 36 which serves to visualize at 38 the number of holes to be drilled as counted at the output of the units for determination of center points.

The different units constituting the installation as a whole will now be described separately as well as the principle of operation involved. The construction of said units also appears in the relevant figures. The logic circuits are shown therein in accordance with U.S. standards 1000 MIL — STD 806 B.

As will readily be understood, the numbered indications mentioned hereinafter are not given in any limiting sense but have been especially chosen and adapted to the case of analysis of a printed circuit in the particular embodiment under consideration.

Figure 3:
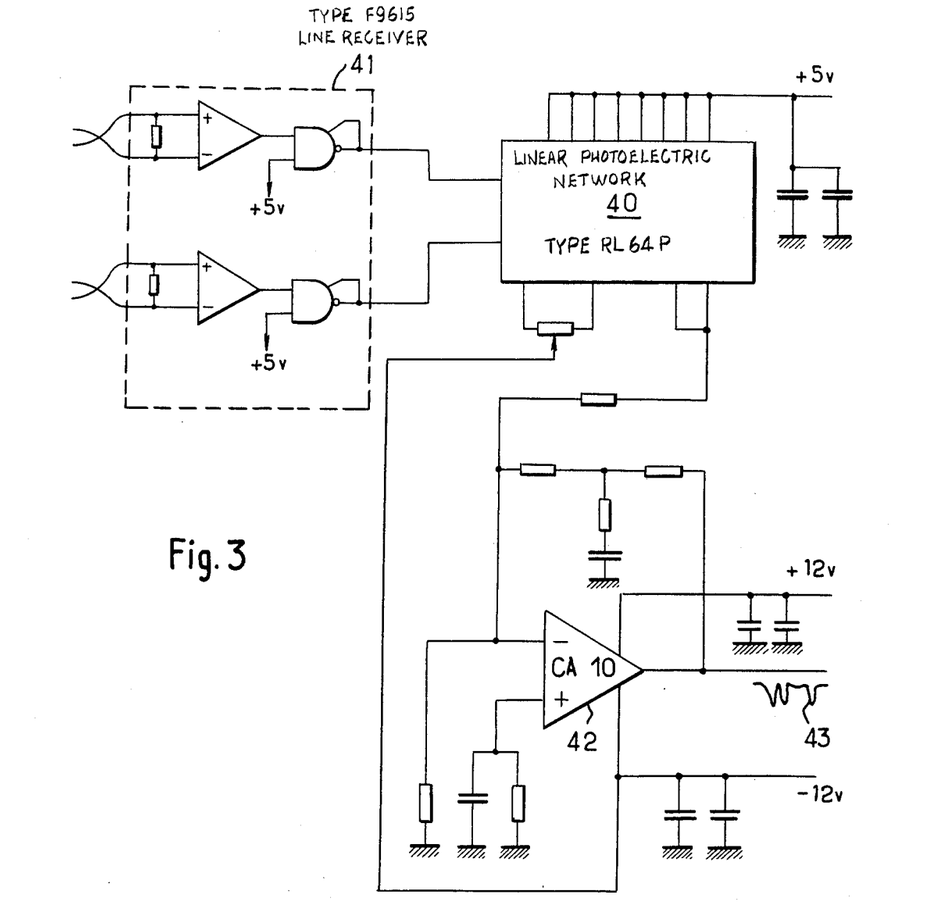
FIGS. 3 and 4 are schematic diagrams of the electronic equipment which serves to form a coded primary image.

The electronic components contained in the reading head are illustrated in FIG. 3. The linear photoelectric network type RL 64P is shown at 40 and the line receiver type F9615 for transmitting the control instructions is shown at 41. These elements are known per se. They deliver at the output of the amplifier 42 a video signal containing in series a number of data corresponding to the number of successive photosensitive elements in the network, namely 64 in the particular case under consideration, each time a reading order is transmitted by the control device. In fact, each element which is exposed to the light source through the document placed on the reading table produces a voltage pulse in the video signal. Since the photosensitive elements of the network are aligned parallel to the Y-axis, the 64 data of the signal correspond to a constant-X reading line. One line reading by the network is thus performed each time this latter has moved forward by one step in translational motion along the X-axis. The value of said step is 50 microns and is equal to the distance between two adjacent photosensitive elements in the network.

Figure 4:
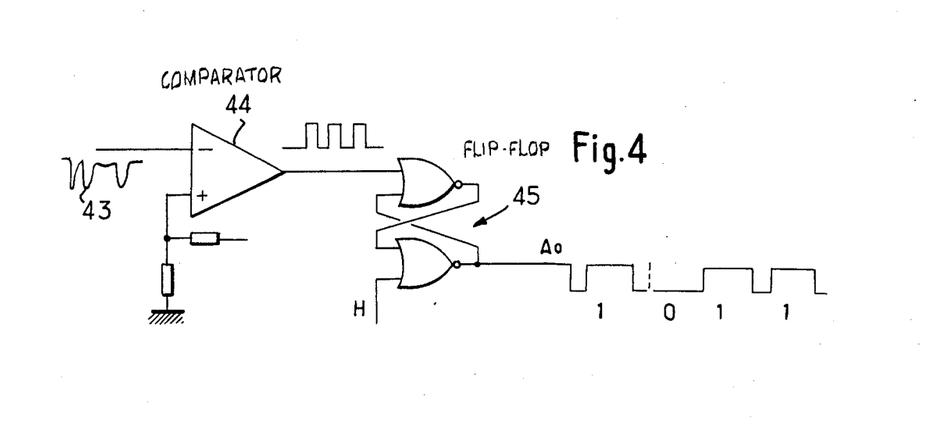

The video signal obtained at each reading line is transmitted to a comparator 44 (as shown in FIG. 4) for shaping the data, then to a flip-flop 45 for resetting the data on a clock phase H. There is thus obtained a representation of the successive lines in binary code form in which different logical states represent respectively the transparency or the opacity of the document under analysis at each point of the line. The expression "primary image" is intended to designate the coded image corresponding to a series of lines at this stage. The logical state 1 will be assigned arbitrarily to the transparency.

The data of the successive primary lines (Ao) are addressed to the erasing units, each unit being intended to process successively individual images of 64 lines.

Figure 5:
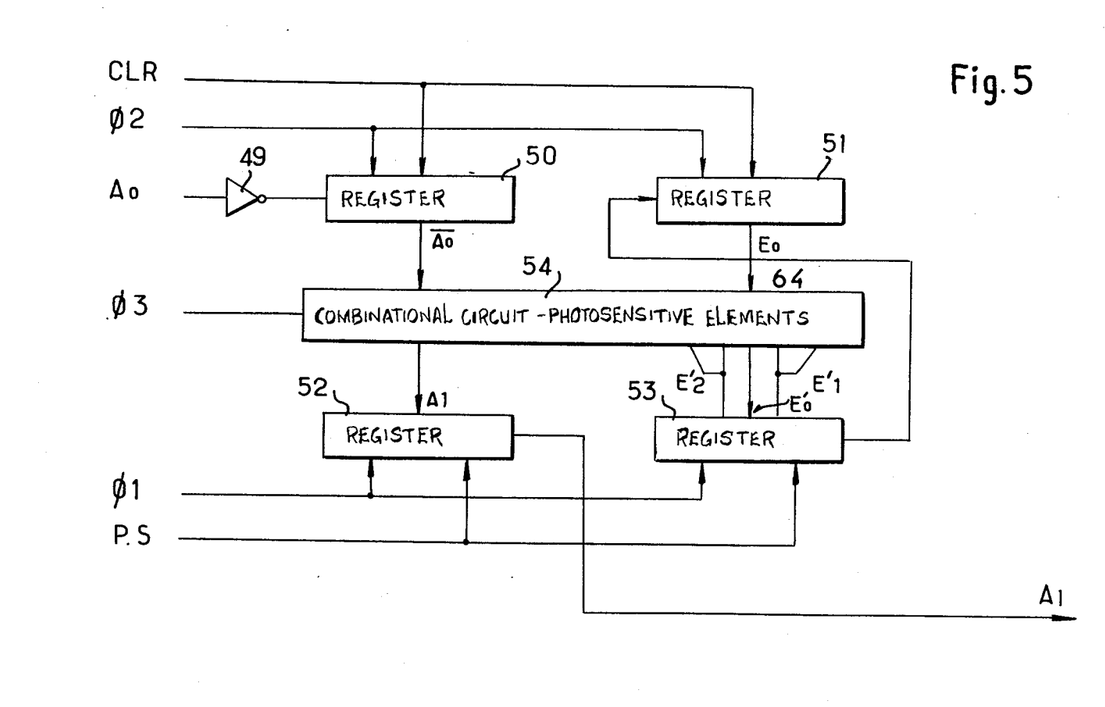
FIG. 5 is a schematic diagram of the erasing circuits of an erasing unit.

In the case of each unit, the erasing circuits comprise four registers 50, 51, 52, 53 and a combinational circuit 54 as shown in FIG. 5. The four registers correspond respectively to the data which are coded line by line and relate to:

the primary image Ao which is, however, reversed at the input (at 49), namely $\overline{Ao}$, the erasing instructions at the input of the combinational circuit, namely Eo, the clear image obtained after erasing, namely A1, the erasing instructions at the output of the combinational circuit, namely E'o.

The registers 50 and 51 in the case of $\overline{Ao}$ and Eo are in fact groups of 8 registers in series each having 8 bits and one series input and 64 parallel outputs. The registers A1 and E'o are in fact groups of 8 registers in series each having 8 bits and 64 parallel inputs and one series output. The outputs of the $\overline{Ao}$ and Eo register are all reset to zero by a CLR signal and the data are introduced therein at the frequency of the clock signals $\phi$ 2. The data are introduced together into the registers A1 and E'o under the control of the P.S. signal supplied by the clock register and are delivered therefrom in series at the frequency of the clock signals $\phi$1. The output of the register E'o is connected to the input of the register Eo, with the result that the erasing instructions for each primary line are constituted by an "erasing" line obtained at the same time as the preceding clear line.

Figure 6:
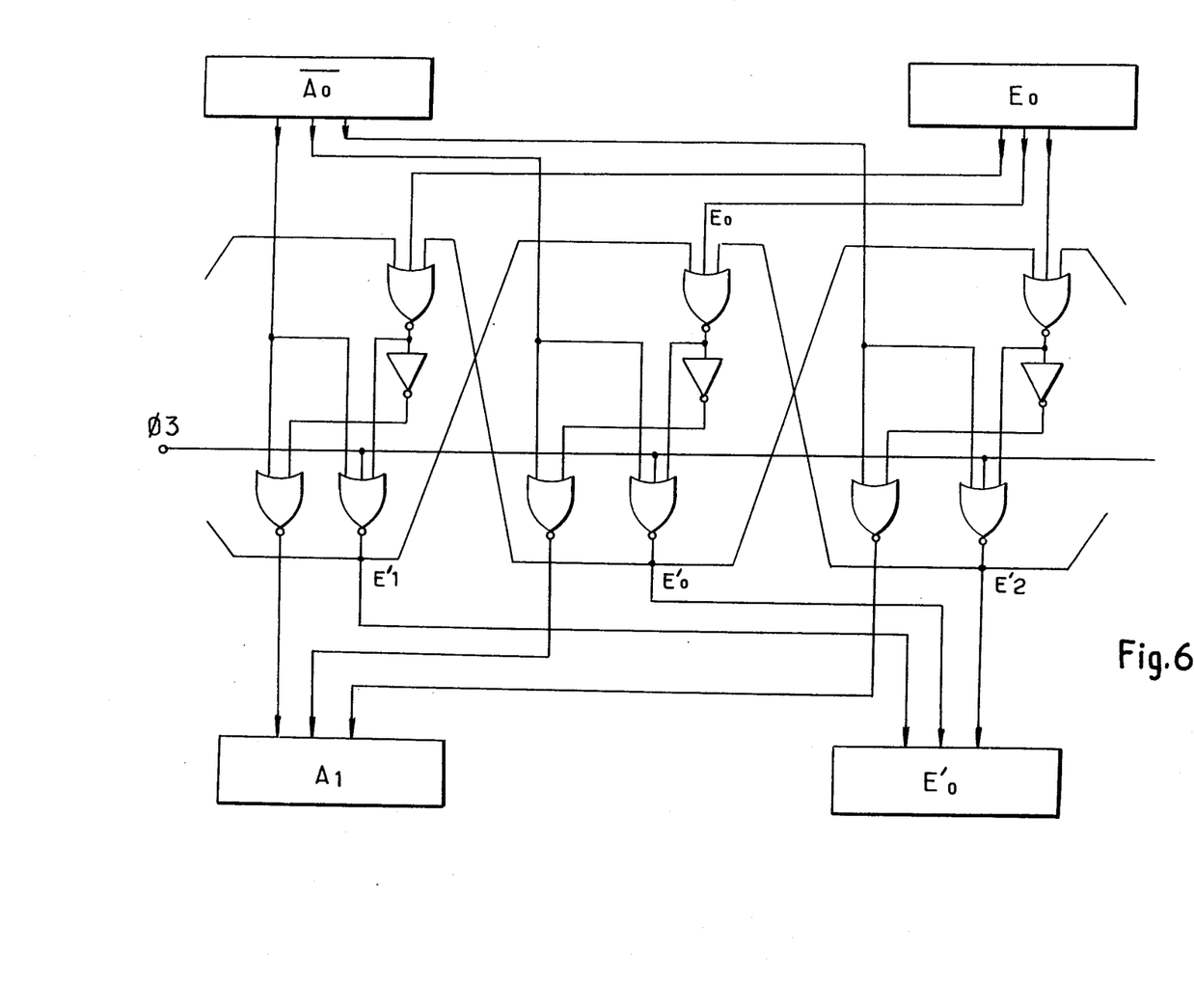
FIG. 6 shows more especially the constructional arrangement of the cells of the combinational circuit of FIG. 5.

The combinational circuit 54 provides a connection between all four registers (the 128 outputs of the input registers to the 128 outputs of the output registers). Said circuit comprises 64 identical cells each comprising three logical NOR gates and each having four inputs and two outputs, the connections being as shown in FIG. 6 in the case of three of these cells. The outputs of the circuit thus correspond to the following equations:

$$A1 = Ao. \overline{(Eo + E'1 + E'2)}$$

$$E'o = Ao. (Eo + E'1 + E'2)$$

Erasing conditions are imposed on the end cells of the combinational circuit, that is, at both ends of each reading line and, in addition, prior to admission of the first line of each image of 64 lines by resetting of the register 51 (Eo) and of the register 50 ($\overline{Ao}$).

Figure 7:
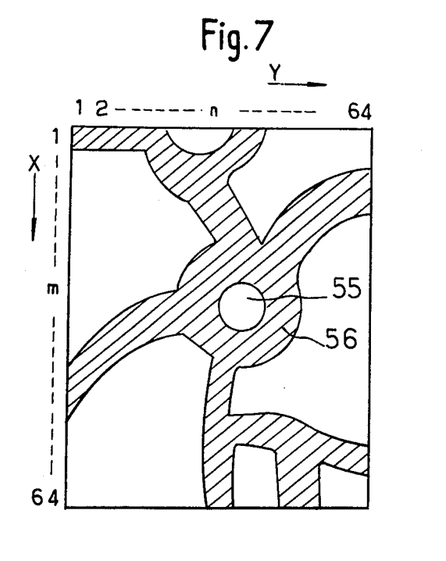
FIGS. 7, 8, 9 and 10 illustrate the operation of the erasing circuits on a coded primary image.
Figure 8:
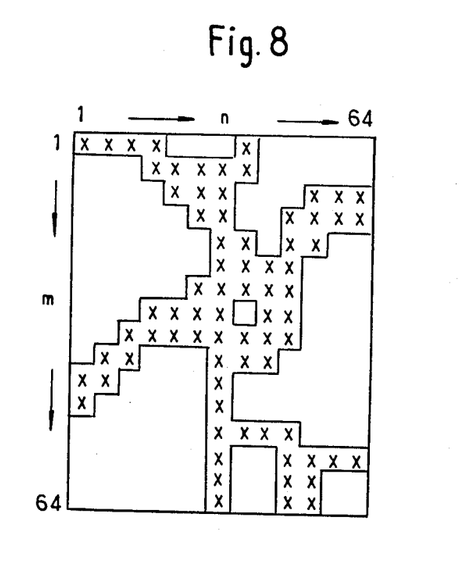
Figure 9:
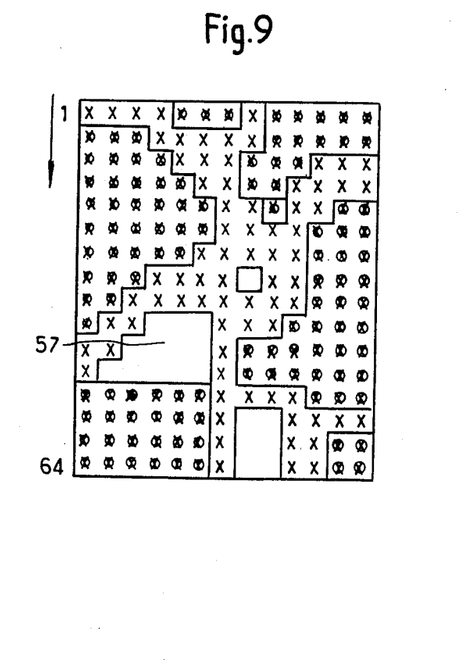
Figure 10:
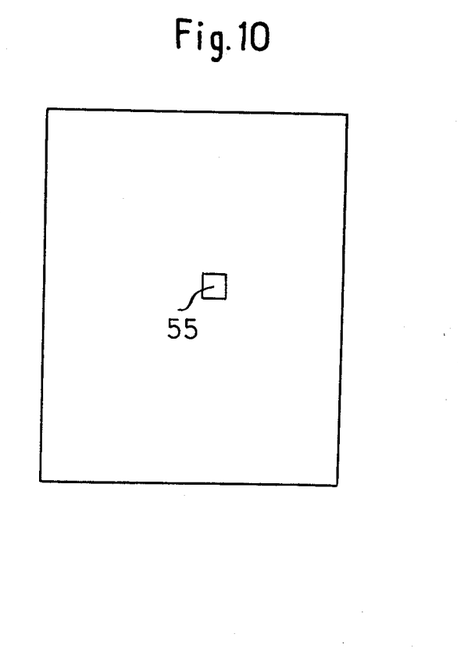

The operation of the erasing circuits may be explained more precisely with reference to FIGS. 7, 8 and 9 which show respectively in the case of 64-line image the real shape of the printed circuit under analysis, the coded primary image (Ao) and the clear image (A1). In fact, in the embodiment hereindescribed, the clear image of FIG. 9 is obtained after a first erasing operation or so-called "forward erasure" whereas the clear image on which determination of the center points is to be effected is that of FIG. 10 which is obtained after a second erasing operation or so-called "return erasure" which will be described hereinafter.

The real image of FIG. 7 comprises zones of darkness which correspond to the circuits to be etched. Said circuits are wholly in coded form in the primary image (as designated by the crosses in FIG. 8). Among the illuminated zones, only the zone 55 which is surrounded by the zone of darkness of a pastille 56 will remain on the final clear image of FIG. 10. FIG. 9 shows the points of erasure of the forward erasure as performed in succession from line 1 to line 64.

In the coded primary image, the illuminated points are represented by the logical state 1 (Ao = 1) and the dark points are represented by the logical state 0. At each point of the image defined by an index $n$ along a line and by a line index $m$:

if Ao,$m,n$ = 0, there is no possibility of erasure, consequently A1,$m,n$ = 0 and E'o,$m,n$ = 0. This corresponds to a point of the zone of darkness of the circuit in which no erasure is performed;

if Ao,$m,n$ = 1, erasure takes place on condition that:
either Eo,$m-1,n$ = 1, in which case erasure takes place in the direction of reading of the lines;
or E'o,$m,(n-1)$ = 1 or E'o,$m,(n+1)$ = 1, in which case series erasure takes place along a line in one direction or in the other provided that there does not exist any point in which E'o,$m,j$ = 1 and Ao,$m,j$ = 0.

Erasure therefore propagates from line to line and along a line.

In all, we have at each point of the image:

$$A1,m,n = Ao,m,n. \overline{(Eo,m-1,n + E'o,m, (n-1) + E'o,m, (n+1)}$$

$$E'o,m,n = Ao,m,n. (Eo,m-1, n + E'o,m, (n-1) + E'o,m, (n+1)$$

The following conditions of erasure are imposed on the edges of the image:
at the beginning of the image in the case of the first line: Eo = 1,
at the ends of the lines, the combinational circuit is wired with E'o,$m$,65 = 1 and $$E'o,m,O = 1,$$

which permits erasure at each line starting from the lateral edges of the image. Since the outputs E'o are independent and in order to ensure that these latter are not dependent on the preceding state, a zero reset signal $\phi$ 3 is supplied to each line.

Figure 11:
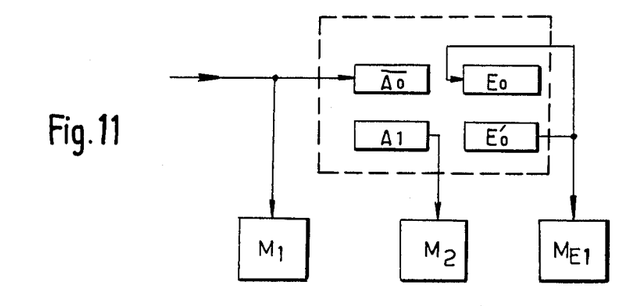
FIGS. 11 and 12 are schematic diagrams showing a complete erasing unit having two different stages of operation.

On the other hand, in the case of the last line of the image, systematic erasure is not performed. In consequence, the forward erasure which is carried out in synchronism with the output of the reading-head data output while analyzing the image from line 1 to line 64 may leave unerased areas such as the enclosed area 57 of FIG. 9. In order to remove such enclosed areas from the clear image, the erasing operation is completed by a return erasure which is carried out in the same manner from the coded primary image but by analyzing the lines in the order 64 to 1. The storage devices provided in the erasing unit make it possible to carry out successively the two erasing operations by means of the same erasing circuits via the connections shown respectively in FIG. 11 and in FIG. 12. These storage devices designated by the references M1, M2, ME1 and M3 are constituted by eight circulating shift registers having four times 128 bits. The capacity is therefore 4 k bits, which corresponds to the quantity of information contained in one image. The registers are connected in series, with the result that the data can simply be stored and, since there is a possibility of recirculation, re-read in a different order to the recording order.

In the case of analysis of a printed circuit which is more particularly contemplated herein, the storage device ME1 does not usually serve any useful purpose. During forward erasure (as shown in FIG. 2), the coded primary image is stored in the order of lines 1 to 64 in the storage device M1 and the image resulting from the forward erasure is stored in the device M2. For the return erasure, M1 is read in the order of lines 64 to 1 and the clear coded image is obtained; return erasure takes place at the same time ("A1 return" data) by reading the storage device M2 simultaneously in the order of lines 64 to 1 ("A1 forward. A1 return" data) (AND gate 59) which corresponds to the clear image of FIG. 10. The storage device M3 is then re-read in the normal order of lines.

In other cases, the erasing instructions are also stored in the storage device ME1 during the forward erasure. In the case of the return erasure and in order to constitute the erasing instructions Eo, lumping of E'o and reading of ME1 is accordingly employed and transmitted through a logical OR gate (the gate 58 in FIG. 12). The storage device M2 and the gate 59 usually serve no useful purpose in that case.

Figures 12, 13:
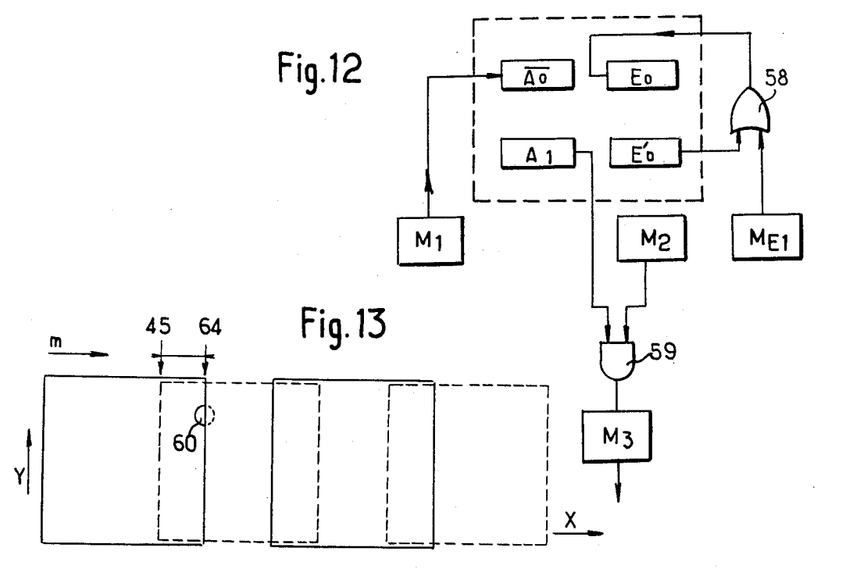
FIG. 13 illustrates the division of images which follow each other on the X-axis.
Figure 14:
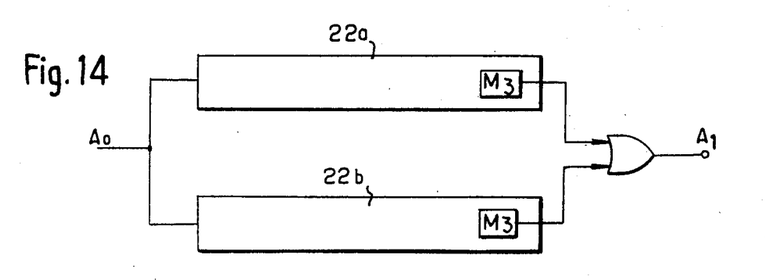
FIG. 14 is a schematic diagram of connections between the two erasing units.

In order to permit complete erasure (forward and return) continuously throughout the displacement of the reading head along the X-axis, the installation comprises two identical erasing units (units 22a and 22b in FIG. 14) for alternately processing the successive coded primary images (of 64 lines). In addition, return erasure is carried out within each unit at a higher frequency than in the case of forward erasure in order to permit partial overlapping of successive images as shown in FIG. 13. This overlapping is ensured by simultaneously addressing the last lines of one image to the two erasing units, with the result that said last lines also constitute the first lines of the following image. By way of example, this overlap is performed over 20 lines, namely during 20 reading steps, which corresponds to 1 mm of the printed circuit under analysis. A time interval corresponding to 27 reading steps is then available for return erasure of each image within the corresponding unit and complete erasure of one image takes place in 83 reading steps. Taking into account the dimensions of the pastilles of the circuit, overlapping ensures that each hole to be drilled is entirely contained within at least one of the primary images and therefore remains in the corresponding clear image even if a hole 60 of this type (as shown in FIG. 13) located at the edge of the preceding image has been erased therefrom. On the other hand, any one hole cannot be recorded twice since the outputs of the storage devices M3 of the two erasing units are wired for logical OR operation (as shown in FIG. 14). A clear coded image A1 is thus obtained continuously, line by line, during the displacement of the reading head along the X-axis with a time-delay of 83 reading steps.

The erasing register 20 (FIG. 1) constituted by a shift register of 86 reading steps having cyclic operations (connected in a feedback loop to its input) and reset to zero at each commencement of scansion along the X-axis makes it possible to form the primary images, to switch said images towards either of the erasing units 22, to carry out switching of data within each unit and to control the storage devices (recording, reading, recirculation). Circulation and transfer of data are under the control of the clock register 18.

Figure 15:
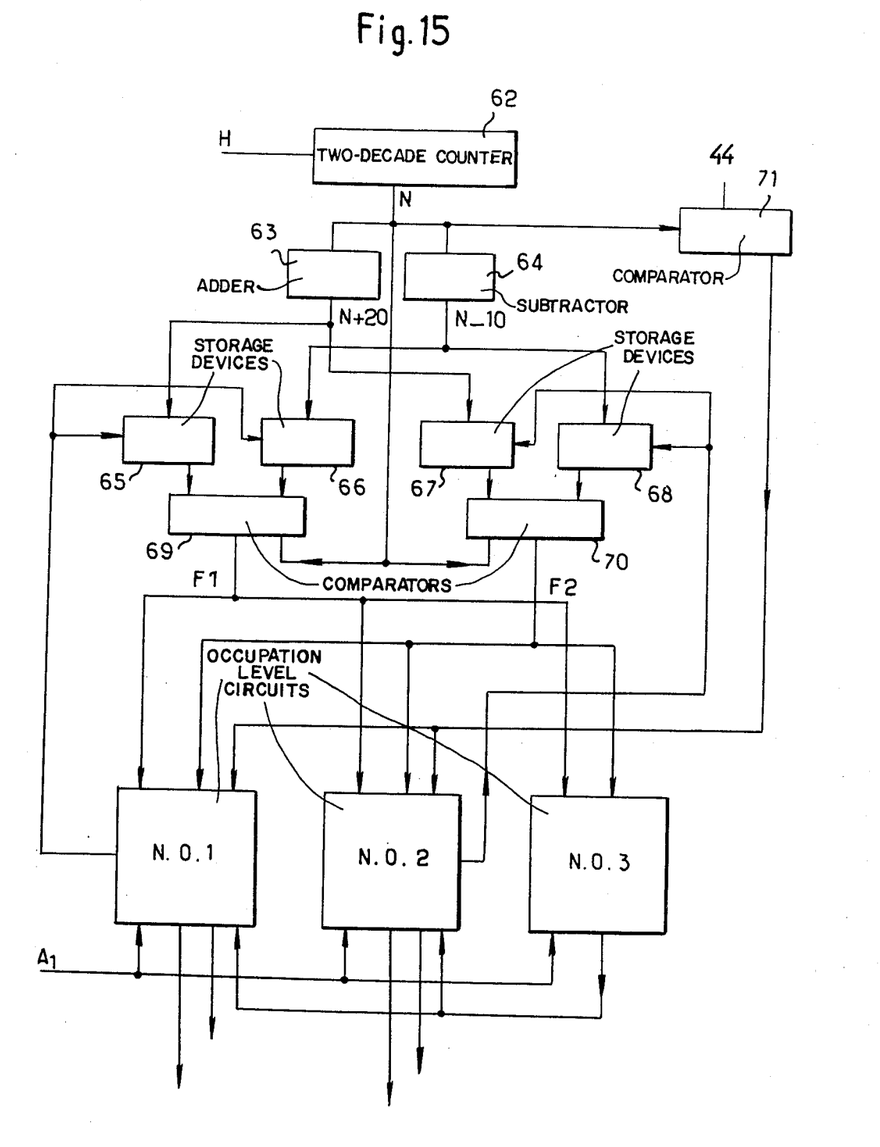
FIG. 15 is a schematic diagram of the circuits for switching the clear-image lines prior to determination of the center points of the holes to be drilled.
Figure 17:
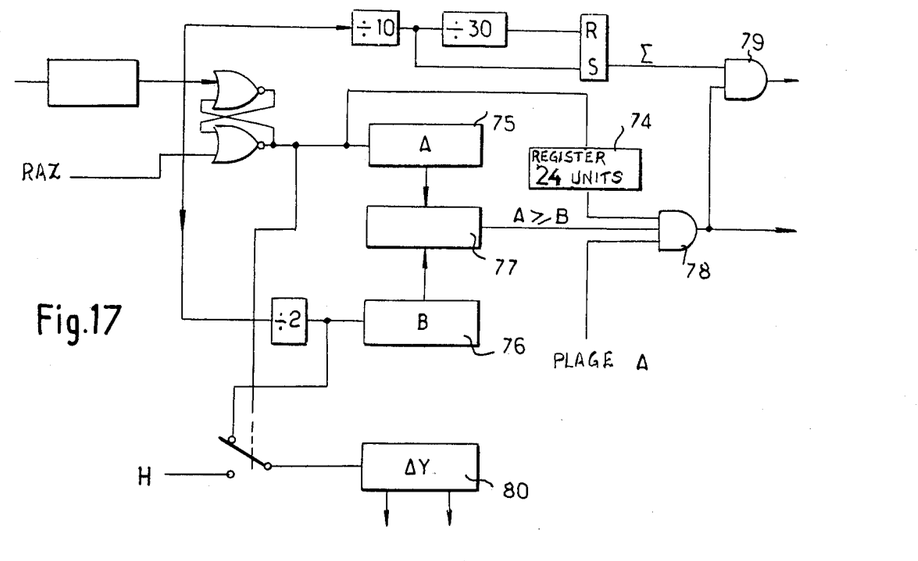
FIG. 17 is a general diagram of a unit for the determination of a center point.

The clear coded image is transmitted line by line by means of the switching circuit of FIG. 15 to either of the units for determining the center points of the holes, each unit being constituted as shown in FIG. 17. Two units are sufficient under the conditions of the particular case herein described since partial overlapping of the images is also achieved between two successive displacements of the reading head along the Y-axis (forward and return scansions), their distance along the Y-axis being 44 steps or pitches of 50 microns and the switching circuit is so designed that, in the case of three holes existing on the same lines of the clear coded image, the particular hole located in the range B of overlap with the following image along the Y-axis is eliminated. The non-overlap range A cannot have more than two holes at the same time for representation in the same reading lines since the holes usually have diameters within the range of 0.3 to 0.9 mm and the center points thereof are located at a distance of at least 1.1 mm from each other.

The switching circuit (shown in FIG. 15) comprises a two-decade counter 62. In each clear line A1, the state N of said circuit gives the index $n$ of each reading point. An adder 63 and a subtractor 64 deliver respectively N + 20 and N − 10. The data just given are introduced into a storage device and continuously compared with the state N of the counter. The result at the output of the comparator determines a window of 30 reading steps on the line. There exist two "window" circuits and therefore four storage devices 65, 66, 67, 68 and two comparators 70. Another comparator 72 defines the ranges A and B by comparing the number 44 with the state N.

Figure 16:
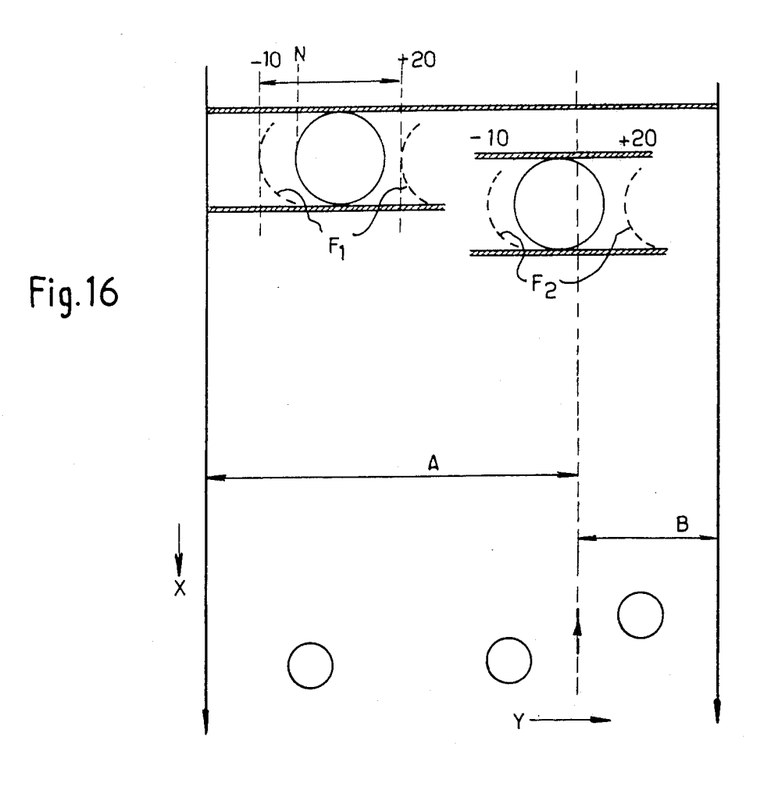
FIG. 16 illustrates the operation of the circuits aforesaid.

Three circuits designated as "occupation level" circuits NO1, NO2, NO3 receive the data from the coded clear lines A1. At the outset, only the circuit NO1 analyzes the lines. At the moment when the edge of a hole appears on a line, the circuit triggers the storage devices 65 and 66 and thus determines the first window $F_1$. This latter moves from one line to the next according to the contour of the hole (FIG. 16). All the corresponding clear image data which necessarily cover the entire hole are transmitted to the first center-point determination unit. While the circuit NO1 is occupied, the circuit NO2 analyzes the remainder of each line (points outside $F_1$). In the case of a second hole on the same lines, said circuit determines a window F2 and the other image data are received in the circuit NO3. The data contained in the window F2 are transmitted to the second center-point determination unit. If the circuit NO3 records the appearance of a third hole, it may create a window F'1 (or F'2) if the window F1 (or F2) is eliminated in favor of the window F'1 (or F'2) and zero-resetting of the center-point determination unit is effected, with the result that the holes located within the range A are preferentially retained. The windows are suppressed in each case at the end of the corresponding hole.

Figure 18:
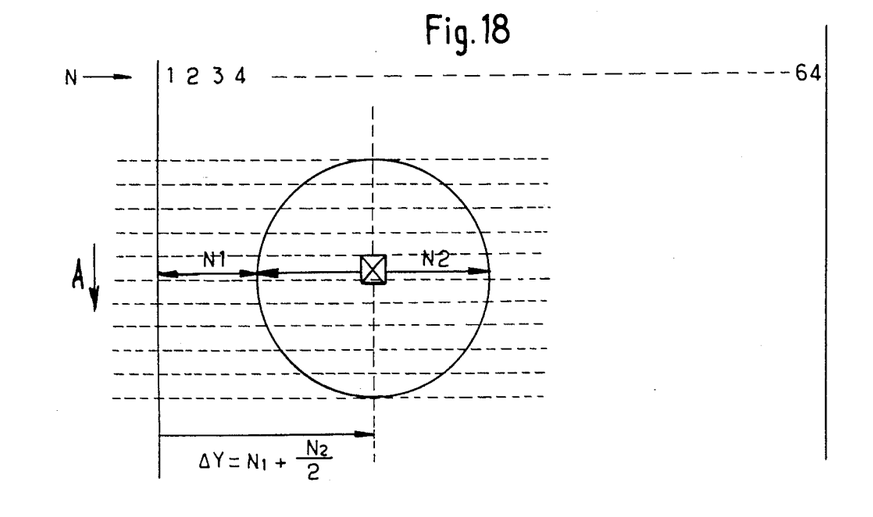
FIG. 18 illustrates the method adopted for the determination of the center point.

A center-point determination unit analyzes one hole at a time. Reference being made to FIG. 17, the number A of lines which encounter the hole (FIG. 18) is counted by means of a counter 75 from the moment when the window is open. At each line reading, the number divided by $$(\frac{N2}{2} = B)$$

of reading points which form part of the hole is counted by means of a counter 76. A comparison is made between the two results of the counters (comparator 77). With the exception of the first two lines, the first time A is equal to or higher than B, it is assumed that said line passes through the center of the pastille. The information is then transmitted for storage of the X and Y values of said center point by means of a logical AND gate 78 which eliminates the first two lines recorded by the register 74 as well as the points at which A is smaller than 45 or in other words corresponds to a hole which is not wholly contained within the range A as defined by the comparator 71 (FIG. 15).

Furthermore, the summation Σ of all the points of the network which have been sensitized by the hole is also effected. At the moment when the window is again closed, if $10 < \Sigma < 300$, the values which are stored in memory are validated and the transfer of these latter to the buffer store (gate 79) is permitted.

The coordinates of the center point are determined from the coordinates Xo and Yo delivered in the case of each point by the counters associated with the repeaters (FIG. 1) as a function of the reading pitch, of the resolution of the drilling machine and of the scale adopted for the document under analysis. These coordinates Xo and Yo are given in 5 decades BCD.

The value Y of the center point depends on the position of the reading head and on a ΔY which is characteristic of the position of the center in the linear network of the reading head. Said ΔY is determined by a counter 80 which, in the case of each line, counts the steps N1 which precede the hole and the number divided by two of the reading points which form part of said hole. The result is:

$$\Delta Y = N1 + \frac{N2}{2} \quad \text{(FIG. 18)}$$

This result is weighted by a coefficient of multiplication which is a function of the resolution of the drilling machine and by a coefficient of division which is a function of the scale of the document.

The value X is corrected by a shift ΔX corresponding to 84 reading steps, namely 83 steps in the case of the time-delay of the clear line in respect of the reading (erasing) and an additional step for determining the center. The values of ΔX are programmed in a dead store 30 (FIG. 1). $X = Xo - \Delta X$ is performed at the time of a forward scan along the X-axis and $X = Xo + \Delta X$ is performed at the time of a return scan.

Figure 19:
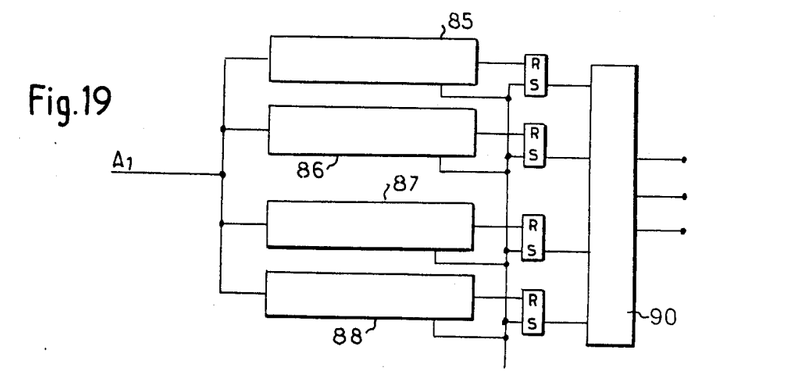
FIGS. 19 and 20 show respectively the units which permit selection of drilling diameters and calculation of the surface area of a circuit to be etched.

In order to permit selection of the drilling diameter in accordance with the unit diagram of FIG. 19, there are employed in the printed circuit pastilles having different values of diameters, each value of diameter being intended to define a drilling diameter with a certain tolerance. By way of example, five values are employed and chosen so as to ensure that there is not any possible overlap between the measured surfaces of holes and four boundary values are defined between these latter.

The unit of FIG. 19 comprises four dividing counters 85, 86, 87, 88 which receive the data from clear lines A1 and the respective coefficients of division of which are values corresponding to the four boundary values mentioned above. At the output of each counter, a storage devices RS records overstepping of the corresponding boundary value. A coder 90 delivers the coded value of the identified diameter at the moment of validation of a center point.

Figure 20:
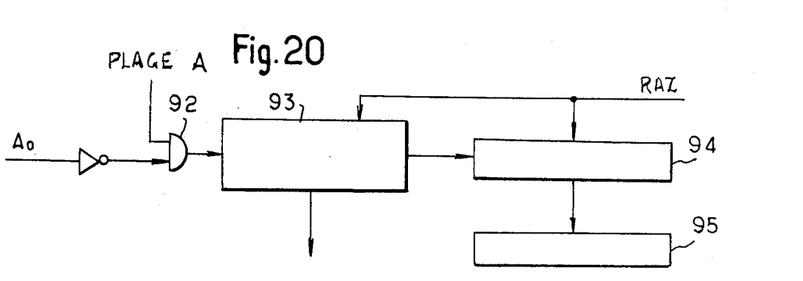

The unit of FIG. 20 summates the number of dark points contained line by line in the primary images Ao. A logical AND gate 92 eliminates the data corresponding to a higher index n 44 and therefore to points which are not located within the range A in which there is no overlap between a forward scan and a return scan along the X-axis. A divider 93 serves to take into account the scale and the surface area of the reading points. Counting is performed at 94 by a three-decade counter BCD and visualized at 95.

The data of said unit are added with those of the unit 36 (number of validated holes to be drilled) to those which are available at the level of the buffer store 32 (shown in FIG. 1). The data just mentioned constitute the control instructions of the drilling machine and essentially comprise the coordinates of the center-points of the holes to be drilled but also the coded indications for the selection of the drilling diameter at each hole. However, this constitutes only one example of the tool-selection instructions which can be determined and recorded automatically if correspondence is established between the surface of the transparent zones within the pastilles (holes) and the tools to be employed.

Many other alternative forms can also be adopted. Thus it has been assumed for the sake of enhanced clarity and in order to simplify the description that the document to be analyzed was constituted by a photo-etching positive of the printed circuit but a photographic negative could also be employed, in which case transparent and dark areas would be reversed. Similarly, where consideration has been given to a step-by-step displacement of the reader along the X-axis, it is possible in practice to carry out a continuous displacement without modifying the step-by-step reading which is performed in accordance with the invention. The displacement itself is a relative movement of displacement and this can be carried out by imparting motion to the document under analysis rather than the reader.

Finally, the different circuits and equipment units which have been described in the foregoing can be constructed in accordance with many alternative designs which are within the capacity of any one versed in the art and all of which therefore form part of the invention.

I claim:

1. A method for the automatic location of particular zones on a surface, especially of points to be machined on the surface of a workpiece by an automatic machine which operates point by point, wherein said method consists:

in giving said particular zones a distinctive appearance with respect to the region surrounding said zones on said surface, especially an appearance which is transparent at the center of an opaque pastille, in automatically scanning the surface in a system of two coordinates, especially perpendicular rectilinear coordinates, by means of a reader comprising at least one detecting element which is responsive to said distinctive appearance, in establishing by means of electrical signals delivered by the reader a primary image coded in binary notation in which two different states represent respectively the presence and absence of said distinctive appearance at each point of the surface which is scanned by the detector, in processing said primary image in coded form in order to erase in successive points from the edges thereof in accordance with said system of coordinates all the states which are representative of the presence of the distinctive appearance encountered before a zone of absence of said distinctive appearance in order to obtain a clear image in coded form only of those points which have said distinctive appearance and are separated from the edges of the image by one point or a plurality of successive points which do not have said distinctive appearance, in determining the coordinates of at least a certain number of the points having a distinctive appearance which remain on said clear image.

2. A method according to claim 1, wherein the primary image is processed in successive lines in logical erasing circuits which, in the case of each point having an index $n$ on a line having an index $m$, satisfy the equations:

$$Al,m,n = Ao,m,n. \; \overline{(Eo,m-1,n + E'o,m,n-1 + E'o,m,n+1)}$$

$$E'o,m,n = Ao,m,n. \; \overline{(Eo,m-1,n + E'o,m,n-1 + E'o,m,n+1)}$$

where Ao, Eo, Al, E'o are given the following notations respectively, in binary code form:

Ao represents a line of the primary image,
Eo represents the erasing instructions of the preceding line,
Al represents the line obtained after erasing,
E'o represents the erasing instructions of the processed line, and wherein erasure is imposed on the one hand in the case of the two end points of each line and on the other hand in the case of all the points of the first line of the image.

3. A method according to claim 2, wherein the primary image is processed twice within said erasing circuits, namely a first time at successive points from the first to the last line and a second time at successive points from the last to the first line.

4. A method according to claim 1, wherein a plurality of primary images are formed successively during a displacement of the reader in a direction at right angles to the lines, the primary images are processed alternately within two different erasing-circuit units, a partial overlap between two successive primary images is formed by addressing the common coded data lines simultaneously to the two units and there is reconstituted at the output of said units a continuous clear image in which there remain the data relating to the presence of the distinctive appearance which were not erased in either of the two units aforesaid.

5. A method according to claim 1 as applied to the automatic elaboration of instructions for drilling the holes of a printed circuit, wherein the surface subjected to the scan is constituted by a photoetching positive of a printed circuit in which the circuit pattern is opaque on a transparent sheet and is provided at the location of the holes to be drilled with pastilles having an opaque zone surrounding a transparent center in which said opaque zone and said transparent center each cover at least one scansion point in said system of two coordinates, or by a corresponding photoetching negative.

6. A method according to claim 1 wherein, starting from a clear image of successive scanning lines in coded form obtained during scanning of the surface in steps of equal length in a system of perpendicular coordinates and containing a zone having a center of symmetry extending over a plurality of adjacent reading points having the distinctive appearance whilst the other points of the image do not have said appearance, there is determined at each line on the one hand the number A of successive lines comprising at least one point having said distinctive appearance and on the other hand the number B which is one-half the number of points having said distinctive appearance on each line, the numbers A and B are compared at each line and when A becomes equal to or higher than B and a recording is taken of the corresponding coordinates of the reader converted to a coded form which correspond substantially to the coordinates of the center-point of said zone.

7. A method according to claim 1, wherein the coded image covers a series of reading lines obtained during a displacement of the reader along a first axis of coordinates (X-axis), the successive lines containing in coded form the data delivered step-by-step by a series of aligned detecting elements in the reader in parallel relation to a second axis of coordinates (Y-axis).

8. A method according to claim 7, wherein the number of reading points preceding the zone on the line of the center-point and the half-number of the number of reading points comprised within the zone on said line are summated and wherein the corresponding coordinate (Y) of the reader is corrected as a function of the total result.

9. A method according to claim 6, wherein the X-coordinate of the reader is corrected as a function of the number of reading steps corresponding to the time of processing by erasure of the primary image.

10. A method according to claim 1, wherein a correspondence is established between the surface of the zones having a distinctive appearance and the tools of a machine for carrying out machining operations, especially the diameters of drilling tools, and wherein a recording is taken not only of said coordinates but also of the total number of reading points comprised within a zone in a coded form which determines the selection of the corresponding tool of the machine.

11. An apparatus for the automatic location of particular zones or a surface, comprising automatic means for displacing a reader in a movement of scanning of a surface on which particular zones have a distinctive appearance with respect to the area surrounding said zones on said surface, especially a transparent appearance at the center of an opaque zone, scanning being performed in a system of two coordinates and said reader being provided with at least one detecting element which is responsive to said distinctive appearance and especially a photoelectric element, means for establishing by means of electrical signals delivered point by point by the reader during the scanning, a primary image in binary coded form of those points of the surface which have said distinctive appearance and those points which do not have said appearance, erasing means for processing said primary image in coded form by erasing in succession, starting from the edges of said image in accordance with said system of coordinates, all those points having the distinctive appearance and encountered before a point which does not have said appearance in order to obtain a clear image in coded form, and means for determining and recording in coded form the coordinates on said surface of particular points selected on the coded clear image.

12. An apparatus according to claim 11, wherein the reader comprises a series of detecting elements aligned along one of the axes of coordinates for delivering a series of electrical signals as a function of the presence or absence of the distinctive appearance at the corresponding successive reading points, and means for converting said signals into a series of binary-coded data constituting a primary image line.

13. An apparatus according to claim 11, wherein at least one erasing unit for processing an image of primary successive lines in coded form comprises a first register having a series input and parallel outputs for receiving said image line by line, a second register having a series input and parallel outputs, a third register having parallel inputs and series outputs for delivering line by line a clear image obtained after erasure, a fourth register having parallel inputs and a series output in which the output is connected to the input of the second register in order to transfer erasing instructions thereto, and a combinational circuit connected to the different outputs of the first and second registers and to the different inputs of the third and fourth registers in order to satisfy the equations of claim 4.

14. An apparatus according to claim 13, wherein the erasing unit further comprises a first storage device for storing the data of a series of lines constituting a primary image, said data being directed successively from a first to a last line to said first register at the time of a first treatment of the primary image, at least one of a second storage device for storing the clear image obtained at the output of the third register at the time of said first treatment, or of a third storage device for storing the corresponding erasing instructions at the output of the fourth register, a fourth storage device for storing a clear image obtained after a second erasing treatment of the same primary image carried out from the last to the first line from data of the first storage device and means for making it possible during the second treatment at least either to deliver to the second register the data of the third storage device as re-read from the last to the first line at the same time as those of the fourth register by means of a logical OR gate or to deliver to the fourth storage device by means of a logical AND gate the data of the second storage device as re-read from the last to the first line at the same time as those of the third register.

15. An apparatus according to claim 11, wherein said installation comprises at least one unit for locating the center-point of a hole in a clear image formed by successive lines in coded form and representing solely a hole having a center of symmetry and especially a substantially circular contour, by reading points having the distinctive appearance, said center-point locating unit being provided with a first counter for the number of successive lines each comprising at least one point having a distinctive appearance, a second counter for the number of points having a distinctive appearance in each line, a comparator for comparing at each line the state A of the first counter and the state B of the second counter and delivering a control signal for recording coordinates when A becomes at least equal to B.

16. An apparatus according to claim 15, wherein the center-point locating unit comprises a counter for summating the number of reading points comprised within the hole.

17. An apparatus according to claim 15, wherein said installation is provided between one or a number of erasing units and one or a number of center-point locating units with switching circuits for orienting towards a center-point locating unit solely those line data of the clear image which comprise at least one point having a distinctive appearance and if necessary for distributing within different units the data relating to different holes.

18. An apparatus according to claim 15, wherein said installation comprises a counter for summating the number of center-points whose coordinates are recorded.

19. An apparatus according to claim 11, wherein said installation comprises means for summating the number of reading points which do not have the distinctive appearance on the primary image in coded form prior to selection of the particular points.

* * * * *

UNITED STATES PATENT OFFICE
CERTIFICATE OF CORRECTION

Patent No. 4,059,787     Dated Nov. 22, 1977

Inventor(s) Jean Louis Aimar; Gerard Olin

It is certified that error appears in the above-identified patent and that said Letters Patent are hereby corrected as shown below:

Column 14, line 67, "or" should read --on--.

Signed and Sealed this

Twenty-eighth Day of February 1978

[SEAL]

Attest:

RUTH C. MASON
Attesting Officer

LUTRELLE F. PARKER
Acting Commissioner of Patents and Trademarks